United States Patent
Fu-Kang

(10) Patent No.: US 6,169,015 B1
(45) Date of Patent: Jan. 2, 2001

(54) METHOD AND APPARATUS FOR CONTROLLING THE DOSAGE OF IONS IMPLANTED INTO A SEMICONDUCTOR WAFER

(75) Inventor: Tien Fu-Kang, Hsin-Chu (TW)

(73) Assignee: Taiwan Semiconductor Manufacturing Company, Ltd, Hsin Chu (TW)

(*) Notice: Under 35 U.S.C. 154(b), the term of this patent shall be extended for 0 days.

(21) Appl. No.: 09/483,220

(22) Filed: Jan. 14, 2000

(51) Int. Cl.⁷ .................. H01L 21/04; H01L 21/425; H01J 37/304
(52) U.S. Cl. .............. 438/510; 438/514; 250/492.21
(58) Field of Search ................. 250/492.21, 397; 438/510, 514, 513, 519

(56) References Cited

U.S. PATENT DOCUMENTS

| | | | |
|---|---|---|---|
| 5,384,465 * | 1/1995 | Amour et al. | 250/492.21 |
| 5,475,618 * | 12/1995 | Le | 250/492.2 |
| 5,981,961 * | 11/1999 | Edwards et al. | 250/492.21 |

* cited by examiner

Primary Examiner—Matthew Smith
Assistant Examiner—Lex. H. Malsawma
(74) Attorney, Agent, or Firm—Tung & Associates

(57) ABSTRACT

An interlock controller device is used in an ion implantation machine to prevent an overdose ions from being implanted into a semiconductor wafer due to fluctuations in the power supply to the ion beam used to scan the wafer. The device stores a pre-selected count corresponding to the number of times the wafer should be scanned at a particular ion beam current in order to achieve a desired implantation dose, and decrements the count each time the wafer is scanned. When the count is decremented to zero, the device turns off the current to the ion beam, thereby terminating ion implantation, even though scanning of the wafer is continued.

12 Claims, 1 Drawing Sheet

METHOD AND APPARATUS FOR CONTROLLING THE DOSAGE OF IONS IMPLANTED INTO A SEMICONDUCTOR WAFER

FIELD OF THE INVENTION

The present invention generally relates to equipment for manufacturing semiconductor devices, and deals more particularly with a method and apparatus for controlling the dosage of ions implanted into a semiconductor wafer during manufacturing of a semiconductor device.

BACKGROUND OF THE INVENTION

Ion implantation has become a standard, commercially accepted technique for introducing conductivity-altering dopants into a workpiece, such as a semiconductor wafer, in a controlled and rapid manner. Conventional ion implantation machines include an ion source that ionizes a desired dopant element which is then accelerated to form an ion beam of prescribed energy. This beam is directed at the surface of the workpiece. Typically, the energetic ions in the beam penetrate into the bulk of the workpiece and are embedded into the crystalline lattice of the material to form a region of desired conductivity. This ion implantation process is typically performed in a high vacuum, gas tight process chamber which encloses a wafer handling assembly and the ion source. This high vacuum environment prevents dispersion of the ion beam by collisions with gas molecules and also minimizes the risk of contamination of the workpiece by air-borne particulates.

The ion beam path in typical ion implantation systems includes an ion source, electrodes, an analyzing magnet arrangement, an optically resolving element, and a wafer processing system. The electrodes extract and accelerate ions generated in the ion source produce a beam that is directed toward the analyzing magnet arrangement. The analyzing magnet arrangement sorts the ions in the ion beam according to their charged-to-mass ratio, and the water processing system adjusts the position of the workpiece along two axes relative to the ion beam path.

In particular, as each individual ion leaves the electrodes and enters the analyzing magnets, its line of flight is bent into a path having a radius proportional to the square root of the mass of the ion. A resolving slit in the analyzing magnet arrangement, in conjunction with the optical resolving element, focus ions having a pre-selected charge-to-mass ratio so that the ions are directed toward the workpiece. Ions not having the selected charge-to-mass ratio are focused either to the left or to the right of the resolving slit and are thereby selected out of the final ion beam striking the target work piece.

The selected ions exiting the analyzing magnet and optical resolving element arrangement are then generally moved across the workpiece in a controlled manner to spread the particles across the workpiece. In doping semiconductor wafers, a common technique is to move the wafers relative to a fixed beam of selected ions along two orthogonal directions. The wafers are supported on a moving surface, which moves them at a high speed along a scanning direction and at a slower speed along an orthogonal direction. Using a slightly different technique, the scanning process is performed by positioning a multiple number of the wafers around the circumference of a rotating disk. The disk is rotated so that all of the semiconductor wafer are scanned at a high speed, with the ion beam being moved at a comparatively low speed in the radial direction of the rotating disk so that the individual semiconductor wafers are scanned at a low speed.

The quantity of ions implanted into a semiconductor wafer is sometimes referred to as the ion "dose" remaining in the wafer after the implantation process. It is extremely important to maintain control over the amount and uniformity of the implanted dose, from wafer-to-wafer, and from batch-to-batch. Because of the relatively large number of ions implanted into the wafer during each scan, even a single extra scan beyond a pre-computed scan number can result in an overdose, causing the wafer to be scrapped. In calculating a prescribed, "correct" dosage level, it is important to determine the current of the ion beam, in addition to determining the scanning velocity and the number of scans. The current level of ion beams are notoriously unstable, particularly at higher levels of energy, e.g. 80 KeV to 150 KeV. At lower operating currents, scanning may be conducted for single wafers for only 10 seconds, whereas at higher current levels where a greater dosage is desired, scanning may be conducted from 1½ minutes up to 40 minutes.

Typical ion beam implantation systems include a dose controller that allows an operator to pre-select a number of parameters that determine the dosage to be applied for a particular application. For example, based on empirical data and control readouts, the operator can use the dose controller to predict the proper amount of ion beam current that needs to be selected for a given scan rate and number of scans to achieve a desired dosage. While scanning speed and the number of scans can be controlled with some degree of precision, the current level of the ion beam is difficult to control, and thus is not always predictable. Much of the instability of ion beam current is related to fluctuations in the level of power supplied to the ion implantation machine. Since this same power source is also used to supply power to the dose controller, error in predicting values sometimes occurs.

Accordingly, there is clear need in the art for an improved method and apparatus for controlling the dose of ions implanted into a semiconductor wafer that eliminates error, and consequent over-dosage resulting from fluctuations in the ion beam current. The present invention is directed towards satisfying this need.

BRIEF DESCRIPTION OF THE INVENTION

In accordance with the present invention, a method and apparatus is provided for controlling the dosage of ions implanted into a substrate, such as a semiconductor wafer. An interlock controller device is used in combination with a dose controller to calculate the correct number of scans at a particular ion beam current and to maintain a count-down of the pre-selected scan number. When the count-down reaches 0 the interlock device switches off current to the ion beam, thus terminating ion implantation, even though actual scanning of the wafers continues.

According to one aspect of the invention, apparatus is provided for controlling the dose of ions implanted into a semiconductor wafer using an ion implantation device of the type including mean of generating a beam of ions, means for causing the ion beam to scan the wafer and means for sensing each scan of the beam. The apparatus comprises means for counting the number of times the wafer is scanned by the beam and for outputting a shut-off control signal to the beam generating means when the counted scans reaches a pre-selected number. The beam generating means is responsive to the shut-off signal to shut off electrical current supplied to the beam. The counting means preferably includes a register for storing a pre-calculated count related to the desired number of times the beam is to scan the wafer, and means for decrementing the count stored in the register each time the sensing means senses that the beam has scanned the wafer. The apparatus desirably employs opto-isolators for coupling the interlocked controller device with other elements in the system in order to isolate the interlock device against the adverse effects of the high voltage components of the ion implantation machine. The interlock controller device is preferably powered by an uninterruptable power supply that is separate from and independent of the power supply used to power the ion beam.

According to another aspect of the invention, a method is provided for controlling the dose of ions implanted into a semiconductor wafer by a scanning ion beam, comprising the steps of: determining the number of ion beams scans necessary to implant a desired dose of ions into the wafer; storing a count related to the number of determined scans; enabling the beam to scan the wafer and implant ions into the wafer; sensing each scan of the wafer by the beam; decrementing the stored count each time a scan is sensed; and, terminating electrical power to the beam when the decremented count has reached a number related to the determined number of scans. In addition to terminating electrical power to the beam, the method includes issuing an alarm when the decremented count reaches a determined number so as to alert an operator that the implantation process has been terminated.

Accordingly it is a primary object of the present invention to provide a method and apparatus for controlling the dose of ions implanted into a semiconductor wafer which avoid overdoses resulting from fluctuations in ion beam energy.

Another object of the invention is to provide a method and apparatus as described above which automatically terminates current to the ion beam when the desired number of scans of the wafer has been completed, even though the scanning process is continued.

A still further object of the invention is to provide a method and apparatus described above which employs an interlock device for controlling current to the scanning beam, and which can be used in conjunction with conventional dose controllers for ion implantation machines.

These, and further objects and advantages of the present invention will become clear or will be made apparent during the course of the following description of a preferred embodiment of the invention.

BRIEF DESCRIPTION OF THE DRAWINGS

In the drawings, which form an integral part of the specification and art to be read in conjunction therewith, and in which like reference numerals are employed to designate identical components in the various views.

DETAILED DESCRIPTION OF THE PREFERRED EMBODIMENT

Figure 1:
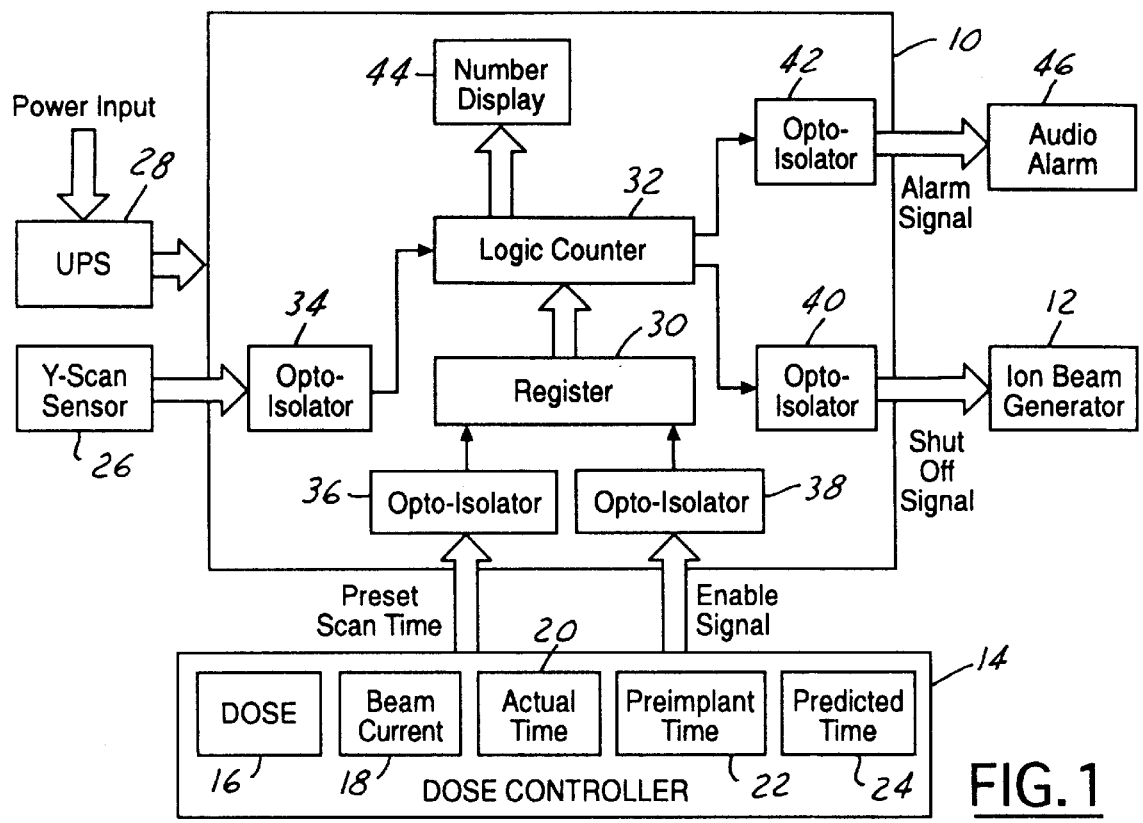
FIG. 1 is an overall block diagram of apparatus for controlling the dose of ions implanted into a semiconductor wafer, which forms the preferred embodiment of the present invention.

Referring now to the drawings, the present invention broadly relates to apparatus for controlling the dose of ions that are implanted into a substrate, such as a semiconductor wafer (not shown) using a beam of ions generated by an ion beam source and directed onto the wafer by various focusing devices. The ion beam source as well as the means for focusing the beam onto the wafer and causing the wafer to scan relative to the ion beam are all well known in the art, and therefore need not be disclosed herein. The fundamental scanning system may be similar to that described in the background section hereinabove. As previously indicated, the ion implantation machine includes an ion beam generator 12 which produces a beam of ions that are directed onto a plurality of wafers typically mounted on a rotating disk (not shown). A conventional sensor 26 is provided that senses each time the ion beam scans the rotating disk in the Y direction i.e. orthogonal to the direction of rotation of the disk. The ion implantation machine will includes a dose controller 14 comprising a computer-based electronic controller which performs a number of functions relating to the control over the dose of implanted ions, including calculating a variety of parameters and outputting signals that control the ion beam generator 12 as well as other parts of the implantation system that affect dosage, such as the rotating disk, current to the ion beam, etc. Specifically, the dose controller 14 will include input means 16 for inputting data relating to the desired dose, means 18 for calculating a desired beam current to achieve the pre-selected dose, means 20 for tracking the actual time that the wafers are being implanted, means 22 for determining the "pre-implantation time" during which parameters are calculated in preparation for the initiating the implantation process, and finally, means 24 for predicting the time during which ions are to be implanted by the ion beam.

The controller 14 typically will include a plurality of manual and automatic control inputs, as well as a series of outputs for controlling dosage. Two of such outputs are a calculated, pre-set scan time, and an enable signal which initiates the implantation timing process. In accordance with the present invention, these latter mentioned signals are delivered to an interlock controller 10 which controls the ion beam generator 12 and is also operative to issue an alarm signal to an audio alarm 46 in the event of an error in the scanning time. Importantly, the interlock control 10 is powered by an uninterruptable power supply 28 or "UPS", which receives power from a conventional source. UPS 28 is independent of the power supply (not shown) used to deliver power to the ion beam generator 12. Accordingly, the interlock controller 10 is not subject to the same types of instabilities and fluctuations in the power supply used to control the ion beam generator 12.

Figure 2:
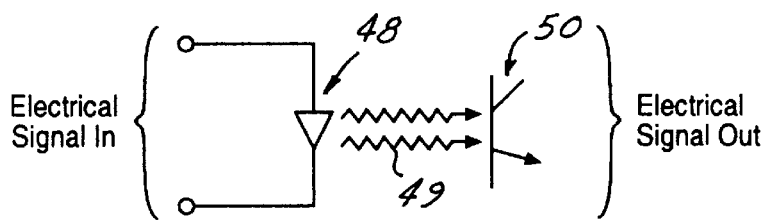
FIG. 2 is a schematic diagram of an opto-isolator used in the apparatus shown in FIG. 1; and, FIG. 3 is a waveform diagram showing the time relationship between 3 signals produced by the apparatus show in FIG. 1.

In addition to the preset scan time signal and the enable signal received from the dose controller 14, the interlock controller receives input signals from the sensor 26 which are indicative of the number of scans that have been completed by the ion beam. The signals input to the interlock controller 10 discussed above are respectively passed through opto-isolators 34, 36, and 38 which are conventional devices well known in the art. Referring specifically to FIG. 2 each of the opto-isolators 34–36 comprises a LED 48 controlled by the incoming signal to the controller 10. The LED 48 generates light 49 that is delivered to a phototransistor 50 which responds to the received light by switching to a conductive state, thereby outputting electrical signal when a signal is input to the LED 48. As a result, electrical isolation is achieved between a sensor and the internal circuitry of the interlock controller 10 and external elements associated with the ion implantation machine, including voltage spikes or the like that are sometimes inherent in the output signals produced by the dose controller 14 and sensor 26. Such extraneous signals and voltage spikes are of particular concern in ion implantation machine that typically include very high working voltages.

The preset scan time and the enable signal are delivered from the dose controller 14 through opto-isolators 36, 38 to a register 30 which is a multi-bit storage device that acts as a buffer or temporary storage medium for storing the preset scan time in digital format. The stored, preset scan time is output in digital form from the register 30 to a conventional digital counter 32 which stores the preset scan time as a digital count number. For example, the number output by the register 30 and stored in the counter 32 might be 21, meaning that the dose controller has determined that the ion beam should scan a wafer in the Y direction 21 times in order to achieve the desired dose based on a set of parameters that include a particular level of current to the ion beam generator 12.

The logic counter 32 includes a trigger input for receiving the signal output by sensor 26 which is passed through opto-isolator 343 before being received by the counter 32. The signal issued by the sensor 26, which simply indicates that the ion beam has completed a single scan, is used to trigger the counter 32. Counter 32 responds to this trigger signal by counting down the stored count, e.g. decrements the stored count from 21 to 20. Significantly, counter 32 is of the so-called count down type which counts down from a beginning number, rather than counting up from a starting number. It has been found that the use of a count down type counter is less prone to error since, when the counter 32 counts down to 0, in the event of an error whereby the ion beam would continue to scan, the next scan results in the counter 32 being decremented down from zero, thereby reaching a count of for example, 999 which is interpreted by the ion implantation machine as a fault or error. When the counter 32 completes its countdown of the stored, preset scan time, and the system goes into a fault mode, the counter 32 issues a shut-off signal and an alarm signal which are respectively passed through opto-isolators 40, 42 to the ion beam generator 12 and an audio (or visual) alarm 46. The alarm signal alerts the operator that a fault has occurred so that the operator can intervene as may be necessary to correct the problem or other wise assess whether an over dosage has occurred. The shut off signal issued by the counter 32 results in shut off of the ion beam generator 12, consequently even though the remaining components of the machine allow the scanning process to continue, the ion beam itself has been shut off, thereby preventing an overdose of ions from being implanted.

The dose controller, as previously mentioned calculates the number of parameters for the purpose of determining the correct preset scan time, i.e. the number of times the wafer should be scanned. Because of fluctuations in the ion beam energy, and other instabilities inherent in such systems, the dose controller 14 makes running, repetitive calculations of the preset scanning time and delivers the final, calculated number to the interlock controller 10 just immediately before, e.g. 0.01 seconds, before a scanning cycle is initiated.

Figure 3:
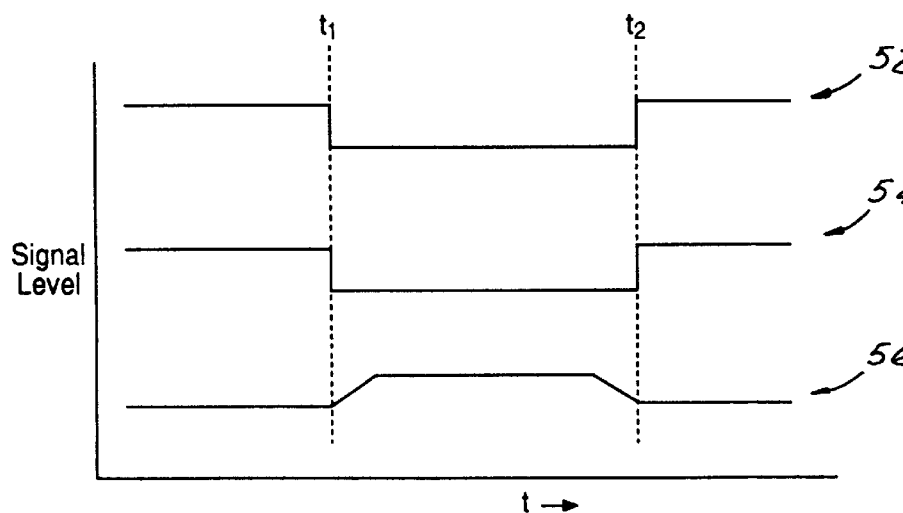

FIG. 3 is a timing diagram showing the relative timing of certain of the signals referred to above. Plot 52 shows that at time t1 the enable signal is delivered from the dose controller 14 to the register 30, and remains on until time t2.

Plot 56 shows that at time t1, when the enable signal is issued by the dose controller 14, the preset scan time and any related data is loaded into the register 30, and remains so stored until time t2.

Plot 54 shows that the ion beam current and the implantation process begins upon the issuance of the enable signal from the dose controller 14 at time t1, and terminates at time t2.

Accordingly, it can be appreciated that the present invention provides a method for controlling the dose of ions implanted into a semiconductor wafer by a scanning ion beam, that comprises the steps of: determining the number of ion beam scans necessary to implant a desired dose of ions into the wafer; storing a calculated number of scans that have been determined; enabling the beam to scan a wafer and implant ions into the wafer; sensing each scan of the wafer by the beam; decrementing the stored count each time a scan has been sensed; and, terminating electrical power to the beam when the decremented count reaches a number related to the number of scans that have been determined.

From the foregoing, it may be appreciated that the method and apparatus described above not only provide for the reliable accomplishment of the objects of the invention, but it do so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. Apparatus for controlling the dose of ions implanted into a semiconductor wafer using an ion implantation machine of the type including means for generating a beam of ions, means for causing said beam to scan said wafer and means for sensing each scan of said beam, comprising:

means for counting the number of times said wafer is scanned by said beam and for outputting a shut off control signal to said beam generating means when the counted scans reaches a pre-selected number, said beam generating means being responsive to said control signal to shut off electrical current supplied to said beam, said beam counting means further comprises:

a register for storing a count related to the desired number of times said beam is to scan said wafer, and means for decrementing the count stored in said register each time said sensing means senses that said beam has scanned said wafer.

2. The apparatus of claim 1, including a dose controller coupled with said register for loading said count into said register, and for enabling said register to be decremented.

3. The apparatus of claim 2, including an opto-isolator connecting said dose controller with said register, and operative to electrically isolate said register from said dose controller.

4. The apparatus to claim 1, including means for visually displaying the count decremented by said counting means.

5. The apparatus of claim 1, including means responsive to said counting means for issuing an alarm when said count is decremented to a pre-selected number.

6. The apparatus of claim 1, including a power supply for supplying power to said counting means, said power supply being independent of a power supply used to supply said electrical current to said beam generating means.

7. The apparatus of claim 6, wherein said power supply is an uninterruptable power supply.

8. The apparatus of claim 1, wherein said decrementing means includes a count down counter.

9. For use with an ion implantation machine of the type having means for producing a ion beam, means for scanning said beam over said wafer, means for sensing each time said beam scans said wafer, and means for controlling the dose of ions implanted in said wafer by said ion beam, an interlock controller device for preventing an overdose of ions from being implanted into said wafer, comprising:

a storage device for coupled with said dose controller for storing a count corresponding to the desired number of times said beam is to scan said wafer in order to implant a correct dose of ions into said wafer, said storage device includes a register having an input for receiving said count for storage in said register, and logic means for comparing the number of times said beam has scanned said wafer with said count and for outputting a beam shutoff signal when said beam has scanned said wafer a number of times equal to said stored count, said logic means includes a count down counter for decrementing the count stored in said register, and for outputting said beam shut off signal when said count has been decremented to zero.

10. The apparatus of claim 9, wherein said logic means includes an input for receiving scan signals representing each scan of said wafer by said beam, said logic means being responsive to each of said scan signals to decrement the count stored in said register.

11. A method of controlling the dose of ions implanted into a semiconductor wafer by a scanning ion beam, comprising the steps of:

(A) determining the number of ion beam scans necessary to implant a desired dose of ions into said wafer;

(B) storing a count related to the number of scans determined in step (A);

(C) enabling said beam to scan said wafer and implant ions into said wafer;

(D) sensing each scan of said wafer by said beam;

(E) decrementing said stored count each time a scan is sensed in step (D);

(F) terminating electrical power to said beam when the count decremented in step (E) has reached a number related to the number of scans determined in step (A).

12. The method of claim 11, including the step of issuing an alarm when the count decremented in step (E) reaches a number related to the number of scans determined in step (A).

* * * * *